United States Patent [19]
Chung et al.

[11] Patent Number: 6,017,817
[45] Date of Patent: Jan. 25, 2000

[54] METHOD OF FABRICATING DUAL DAMASCENE

[75] Inventors: Hsien-Ta Chung, Taichung; Tri-Rung Yew, Hsinchu Hsien; Water Lur, Taipei, all of Taiwan

[73] Assignees: United Microelectronics Corp.; United Semiconductor Corp., both of Taipei, Taiwan

[21] Appl. No.: 09/309,186

[22] Filed: May 10, 1999

[51] Int. Cl.[7] .................... H01L 21/4763; H01L 21/311
[52] U.S. Cl. .................. 438/637; 438/622; 438/628; 438/634; 438/644; 438/633; 438/700
[58] Field of Search .................. 438/637, 639, 438/638, 628, 644, 641, 672, 700, 740, 634, 738, 622, 624, 633, 640, 597, 678, 666, 653

[56] References Cited

U.S. PATENT DOCUMENTS

| | | | |
|---|---|---|---|
| 4,789,648 | 12/1988 | Chow et al. | 438/633 |
| 5,604,156 | 2/1997 | Chung et al. | 438/624 |
| 5,801,094 | 9/1998 | Yew et al. | 438/624 |
| 5,891,513 | 4/1999 | Dubin et al. | 427/98 |

*Primary Examiner*—Charles Bowers
*Assistant Examiner*—Hsien Ming Lee
*Attorney, Agent, or Firm*—Thomas, Kayden, Horstemeyer & Risley

[57] ABSTRACT

A method of fabricating a dual damascene structure. A low k dielectric layer and a cap layer are successively formed on a substrate having an active region. A first photoresist layer is formed on the cap layer and the cap layer is then patterned to expose a portion of the low k dielectric layer. The first photoresist layer and a portion of the low k dielectric layer are simultaneously removed to form a wiring line opening. A second photoresist layer is formed on the cap layer to cover a portion of the wiring line opening. When the step of removing the second photoresist layer is performed, a via hole is formed to expose the active region by simultaneously removing the exposed low k dielectric layer. The via hole and the wiring line opening are filled with a metal layer to form a wiring line and a via.

12 Claims, 4 Drawing Sheets

METHOD OF FABRICATING DUAL DAMASCENE

BACKGROUND OF THE INVENTION

1. Field of the Invention

The invention relates to a method of fabricating an integrated circuit, and more particularly to a method of fabricating a dual damascene.

2. Description of the Related Art

When following the trend of semiconductor device size reduction, the wiring lines of the interconnect structure are necessarily formed increasingly closer to each other. Therefore, the dielectrics with a low dielectric constant (low k dielectrics) currently fills between the wiring lines to prevent parasitic capacitance, which occurs between the wiring lines when the distance between the wiring lines is reduced.

During the dual damascene manufacturing process, the trench and via profile are heavily affected due to the poor etching selectivity between the photoresist and the low k dielectrics while removing the photoresist layer by oxygen plasma Therefore, complicated processes and structure are required for dual damascene in order to avoid the aforementioned problems. FIGS. 1A–1E schematically illustrate fabrication of a dual damascene structure according to prior art. Referring to FIG. 1A, a barrier layer 104, a low k dielectric layer 106, a hard mask layer 108 and an anti-reflection layer 110 are successively formed on a semiconductor substrate 102 having a wiring line 100. The hard mask layer 108 and the anti-reflection layer 110 have a thickness of about 1000–2000 angstroms and 600 angstroms, respectively. Thereafter, the anti-reflection layer 110 is patterned by photolithography with a photoresist layer (not shown) to expose the hard mask layer 108, and then the photoresist is removed by oxygen plasma. The presence of the hard mask layer 108 can protect the low k dielectric layer 106 from being destroyed by oxygen plasma. Using the patterned anti-reflection layer 110 as an etching mask, an opening 112 is formed to expose the low k dielectric layer 106 over the wiring line 100 by anisotropically etching the hard mask layer 108.

Referring to FIG. 1B, a low k dielectric layer 114, a hard mask layer 116 and an anti-reflection layer 118 are successively formed on the anti-reflection layer 110. The steps of patterning the anti-reflection layer 118, removing the photoresist layer and using the anti-reflection layer 118 as an etching mask to define the hard mask layer 116 is then repeated as described above. Accordingly, openings 120a, 120b are formed within the hard mask layer 116a to expose a portion of the low k dielectric layer 114, as shown in FIG. 1C.

Using the hard mask layer 116a as a mask, isotropic etching is then performed on the low k dielectric layer 114, 106 until exposing the barrier layer 104 and the anti-reflection layer 110. As a result, a wiring line opening 122a, a via hole 124 and a trench 122b are formed, as illustrated in FIG. 1D. Thereafter, the exposed barrier layer 104 is removed to expose the wiring line 100, as shown in FIG. 1E. The wiring line opening 122a, the via hole 124 and the trench 122b are filled with a metal layer to form wiring lines 126a, 126b and a via 124.

During the fabrication of dual damascene, the barrier layer 104, the anti-reflection layer 110 and the hard mask layer 108, 116a are dielectrics with high dielectric constant, such that the effective capacitance of the dual damascene structure is increased. As a result, the advantage of the low k dielectrics 106, 114 is canceled out and the parasitic capacitance between the wiring lines cannot be diminished.

In addition, the photoresist layer (not shown) for patterning the anti-reflection layer 110, 118 and hard mask layer 108, 116 is removed by oxygen plasma and oxygen plasma easily reacts with low k dielectric layer 114, 106. The reaction between the low k dielectric layer 114, 106 and the oxygen plasma not only changes the property of the low k dielectric layer 114, 106 such that the dielectric constant thereof is increased, but also destroys the sidewall profile of the opening 122a, 122b within the low k dielectric layer 114, 106 due to the lateral etching of the oxygen plasma.

Moreover, the interconnect structure of dual damascene as described above in FIG. 1E is achieved by a series of steps including deposition, photolithography and etching. The complicated processes require a large amount of cycle time and increase manufacturing cost.

SUMMARY OF THE INVENTION

This invention therefore provides a method of fabricating a dual damascene structure, thereby reducing the effective capacitance of the low k dielectrics. Thus, the parasitic capacitance between the wiring lines is effectively reduced so as to increase the transmittance of the wiring lines.

This invention also provides a method of fabricating a dual damascene that prevents the profile of a low k dielectric layer from being damaged while removing a photoresist.

The invention is directed towards a method of fabricating dual damascene. A low k dielectric layer and a cap layer are successively formed on a substrate having an active region. A first photoresist layer is formed on the cap layer and used to pattern the cap layer to expose a portion of the low k dielectric layer. Using the cap layer as an etching stop, the first photoresist layer and a portion of the low k dielectric layer are simultaneously removed to form a wiring line opening and a trench within the low k dielectric layer. Thereafter, a second photoresist layer is formed on the cap layer to cover a portion of the wiring line opening and the trench to expose a portion of the low k dielectric layer. Using the cap layer as a mask, the second photoresist layer and a portion of the low k dielectric layer are simultaneously removed to expose the active region, and as a result, a via hole is formed within the low k dielectric layer. The wiring line opening, the via hole and the trench are filled with a metal layer to form a wiring line and a via.

It is to be understood that both the foregoing general description and the following detailed description are exemplary and explanatory only and are not restrictive of the invention, as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
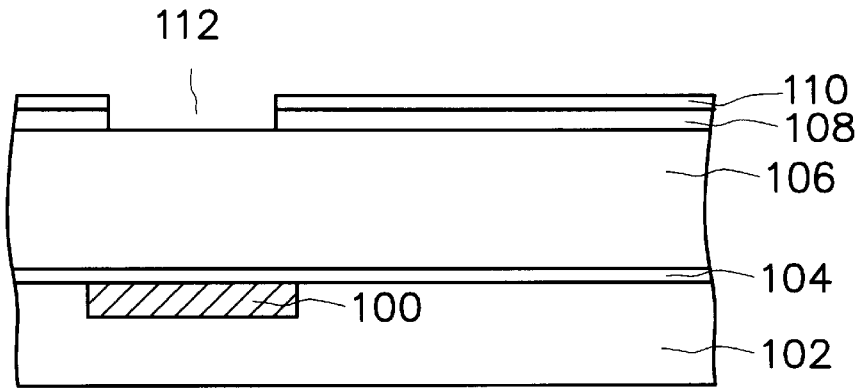
FIGS. 1A–1E are schematic, cross-sectional views illustrating fabrication of the conventional dual damascene.
Figure 1B:
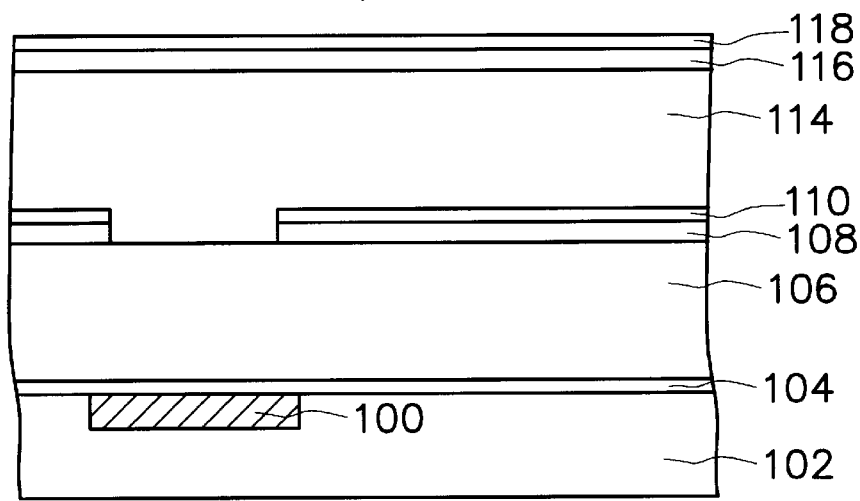
Figure 1C:
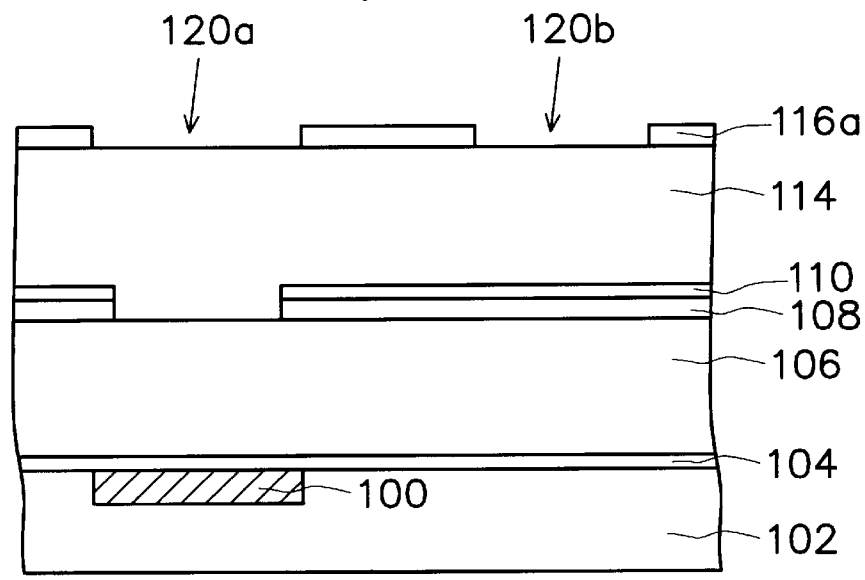
Figure 1D:
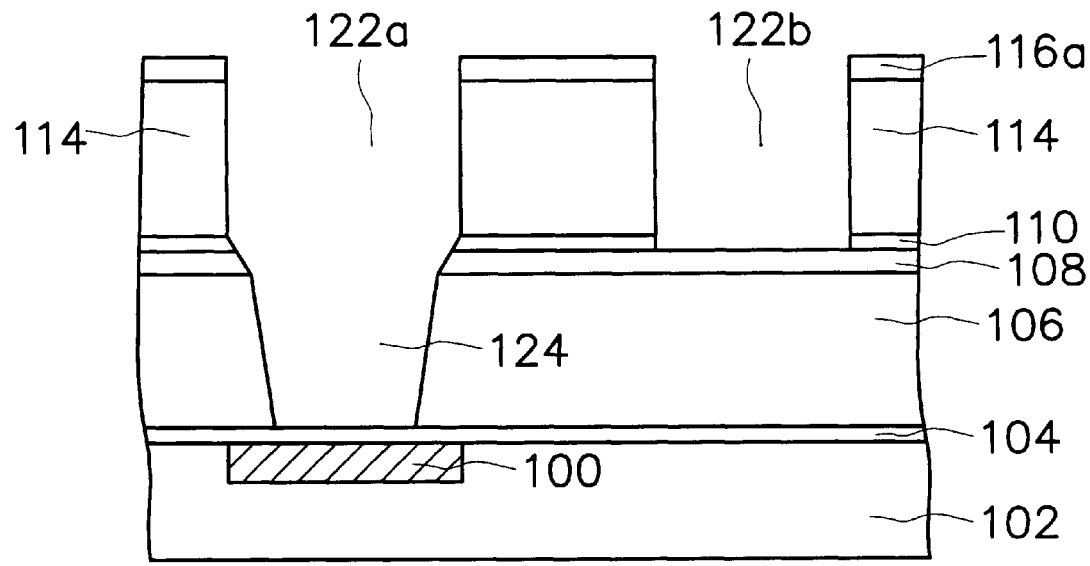
Figure 1E:
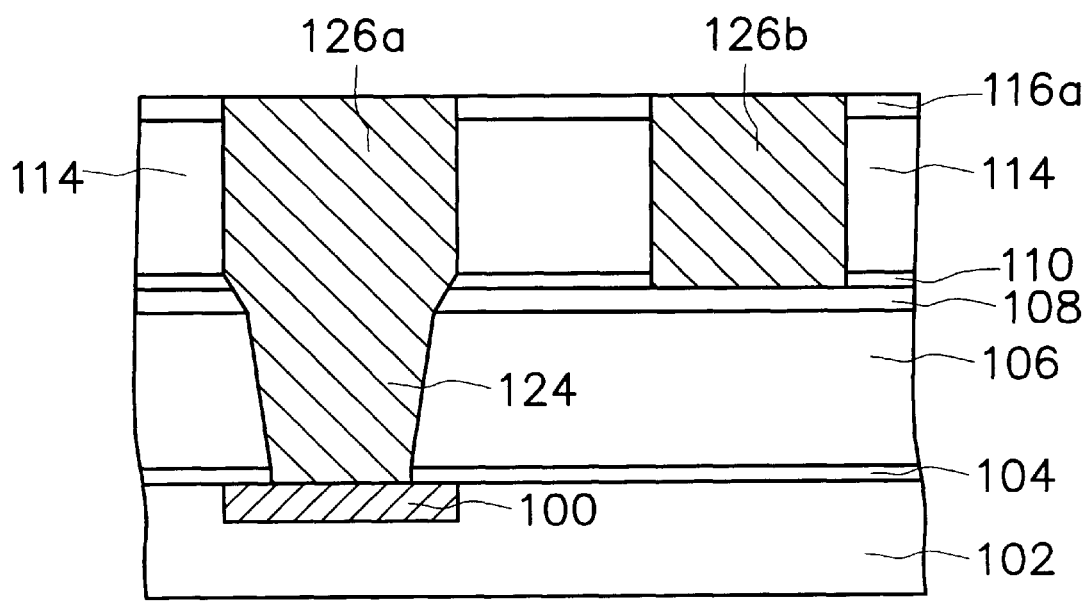

Reference will now be made in detail to the present preferred embodiments of the invention, examples of which are illustrated in the accompanying drawings. Wherever possible, the same reference numbers are used in the drawings and the description to refer to the same or like parts.

This invention adjusts an etching gas recipe for simultaneously removing a photoresist layer and a low k dielectrics, which the etching gas recipe is decided by the thickness of the photoresist layer and the required depth of the via hole and the wiring line opening. When the photoresist layer is removed using the an etching gas recipe, a portion of the low k dielectrics is also removed. The wiring line opening and the via hole are therefore opened and then filled with metal to form a wiring line and a via.

Figure 2A:
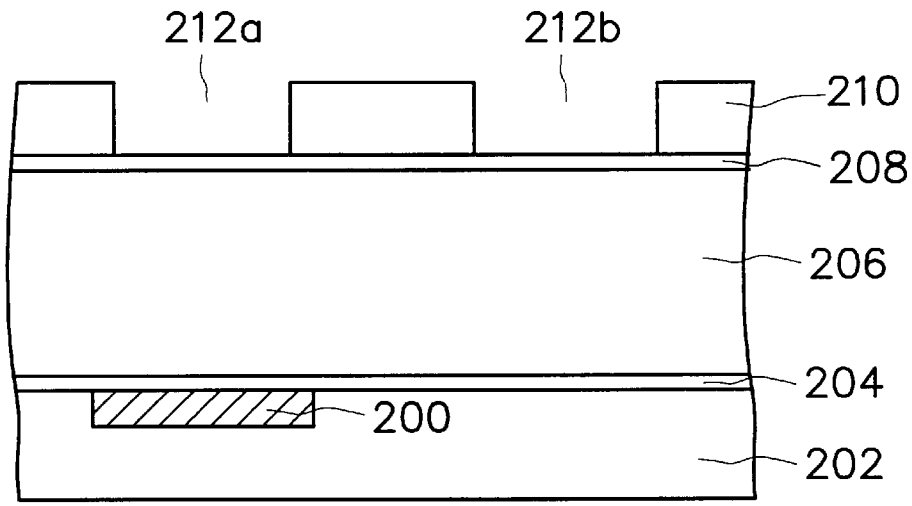
FIGS. 2A–2E are schematic, cross-sectional views illustrating fabrication of a dual damascene in a preferred embodiment according to the invention.

FIGS. 2A–2E are schematic, cross-sectional views illustrating fabrication of dual damascene in a preferred embodiment according to this invention. Referring to FIG. 2A, a barrier layer 204 is formed on a substrate 202 having an active region 200, such as a metal layer made of copper. The barrier layer 204 can be a silicon nitride layer and can be formed by chemical vapor deposition (CVD), for example. A low k dielectric layer 206 with a sufficient thickness for forming a via and a wiring line is then formed on the barrier layer 204. The purpose of the barrier layer 204 is to enhance the adhesion between the substrate 202 and the low k dielectric layer 206 and also to prevent moisture from diffusion.

A cap layer 208 is formed on the low k dielectric layer 206, as shown in FIG. 2A, in which the cap layer 208 can be silicon nitride or silicon-oxy-nitride having a thickness of about 100–200 angstroms and is deposited by CVD, for example. The cap layer 208 does not influence the dielectric constant of the low k dielectric layer 206 due to its thinness. Accordingly, the effective capacitance of the low k dielectric layer 206 and the cap layer 208 is reduced, and the low k dielectric layer 206 preserves its low constant. Thereafter, a photoresist layer (not shown) is coated on the cap layer 208. After exposure and development, a photoresist layer 210 having openings 212a, 212b is formed to expose the cap layer 208, as shown in FIG. 2A. The opening 212a is formed over the active region 200 for the purpose of forming a wiring opening and via hole within the low k dielectric layer 206, and the opening 212b is used to form a trench therebelow.

Figure 2B:
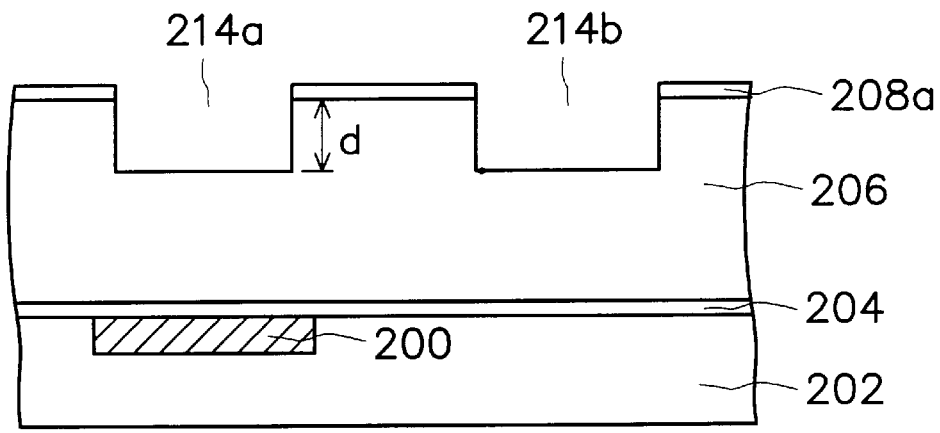

Referring to FIG. 2B, the exposed cap layer 208a is then removed and a portion of the low k dielectric layer 206 is exposed. Using the cap layer 208a as a mask and an etching stop layer, the photoresist layer 210 (FIG. 2A) is removed by plasma, the etching gases of which at least include $H_2/N_2$, $CF_4/O_2$ and $O_2/N_2$. When the photoresist layer 210 is removed, the low k dielectric layer 206 exposed by the cap layer 208a is also removed because it is exposed to plasma. Therefore, the thickness of the photoresist layer 210 has to be adjusted while it is formed, and the ratio of etching gases containing $H_2/N_2$, $CF_4/O_2$ and $O_2/N_2$ has to be adjusted to an optimal recipe with a proper etching selectivity which enables a portion of the low k dielectric layer 206 and the photoresist layer 210 to be completely etched. A wiring line opening 214a and a trench 214b are formed to a predetermined depth 'd' within the low k dielectric layer 206 after completely removing the photoresist layer 210 by using the cap layer 208 as an etching stop. The predetermined depth 'd' is the thickness of the wiring line. Accordingly, the profile of the wiring line opening 214a and the trench 214b within the low k dielectric layer 206 is more vertical due to adjustment of etching recipe and protection of the cap layer 208a. Simultaneously, the profile is not easily damaged when removing the photoresist layer 210.

Figure 2C:
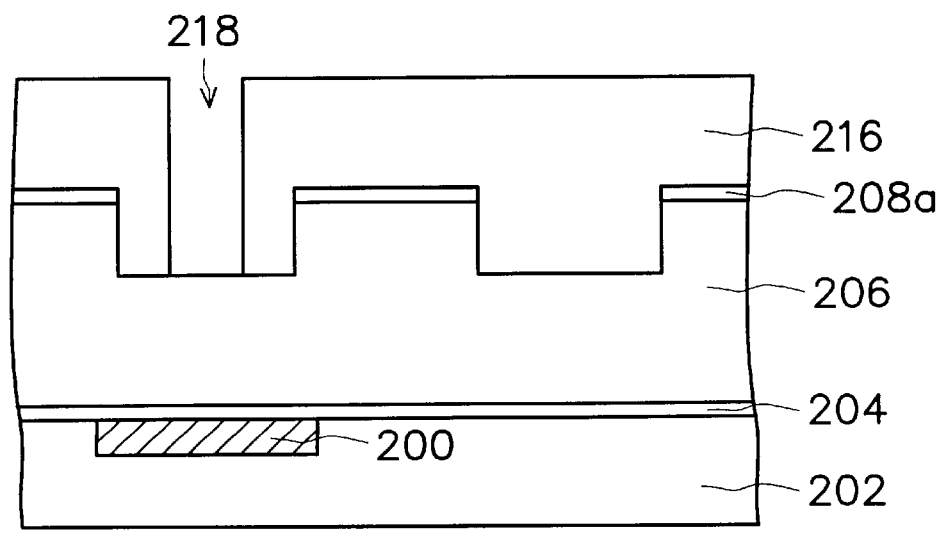

Referring to FIG. 2C, a photoresist layer 216 having an opening 218 is formed on the cap layer 208a and the low k dielectric layer 206 to cover the trench 214b (FIG. 2B) and a portion of the wiring line opening 214a. The opening 218 is used to form a via hole, and a portion of the low k dielectric layer 206 is exposed.

Figure 2D:
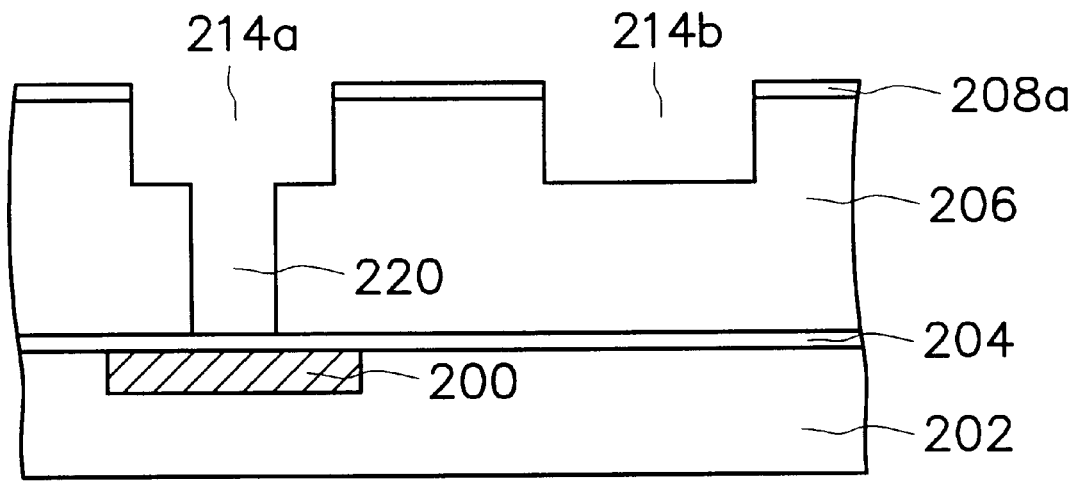

Thereafter, the photoresist layer 216 is removed in a plasma chamber containing $H_2/N_2$, $CF_4/O_2$ and $O_2/N_2$, and the low k dielectric layer 206 exposed by the photoresist layer 216 is simultaneously also removed, as shown in FIG. 2D. The low k dielectric layer 206 underlying the cap layer 208a is not etched due to protection of the cap layer 208a, and as a result, a via hole 220 connecting to the wiring line opening 214a is formed within the low k dielectric layer 206 to expose the barrier layer 204. This step uses the cap layer 208a as a mask and the barrier layer 204 as an etching stop; the thickness of the photoresist layer 216 and the recipe of the etching gases are adjusted to accommodate the etching depth of the via hole 220. The via hole is formed by etching the exposed low k dielectric layer 206 exposed by the photoresist layer 216. Consequently, the photoresist layer 216 and a portion of the low k dielectric layer 206 are simultaneously removed to expose the barrier layer 204, which process forms a via hole 220. In addition, the low k dielectric layer 206 within the trench 214b is exposed when removing the photoresist layer 216.

Figure 2E:
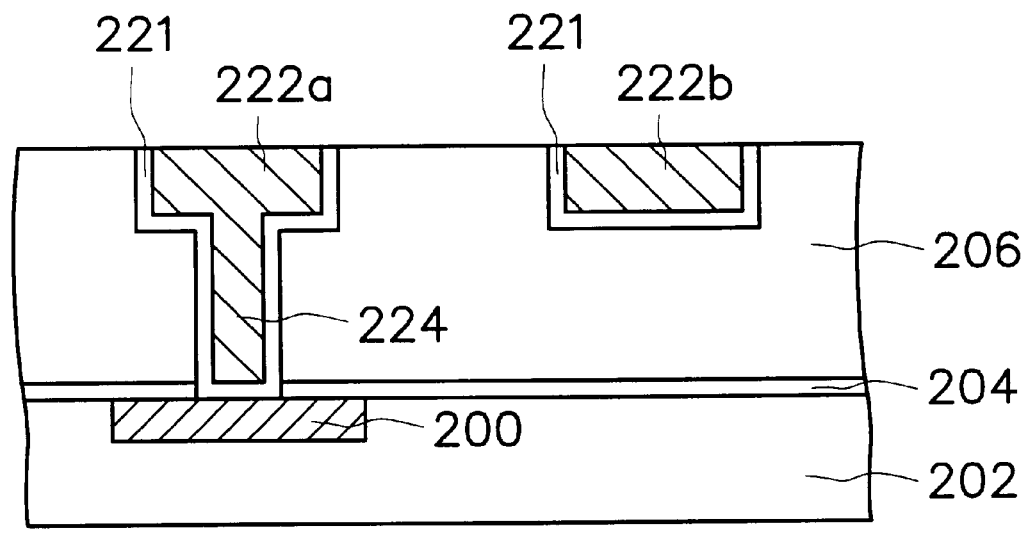

The exposed barrier layer 204 (FIG. 2D) is removed to expose the active region 200, as shown in FIG. 2E. A barrier layer 221 is then formed on the sidewall of the wiring line opening 214, the via hole 220 and trench 214b to enhance adhesion between the low k dielectric layer 206 and the metal layer subsequently formed. The openings 214a, 214b and 220 are filled with a metal layer made from a material such as copper, and a portion of the metal layer is removed from the surface of the low k dielectric layer 206 by chemical mechanical polishing (CMP). As a result, wiring lines 222a, 222b and via 224, are formed as illustrated in FIG. 2E.

In this invention, only a thin cap layer is formed on the low k dielectric layer; therefore, the low k dielectric layer can preserve its low constant. Accordingly, the parasitic capacitance between the wiring lines is effectively prevented, thereby enhancing the transmittance of the wiring lines.

During etching process, removing the photoresist layer and etching the low k dielectric layer are simultaneously performed by adjusting the etching selectivity. Since the photoresist layer is not removed by oxygen plasma, the profile and the property of the low k dielectric layer are improved.

There is no hard mask layer in this invention. Thus, deposition and etching process is reduced. As a result, the fabricating method is simplified and the manufacturing cost is reduced.

Other embodiments of the invention will appear to those skilled in the art from consideration of the specification and practice of the invention disclosed herein. It is intended that the specification and examples be considered as exemplary only, with a true scope and spirit of the invention being indicated by the following claims.

What is claimed is:

1. A method of fabricating dual damascene adapted to a substrate having an active region, comprising:

successively forming a low k dielectric layer and a cap layer on the substrate;

forming a first photoresist layer on the cap layer;

patterning the cap layer using the first photoresist layer to expose a portion of the low k dielectric layer;

removing the first photoresist layer and simultaneously forming a wiring line opening within the low k dielectric layer;

forming a second photoresist layer on the cap layer to at least cover a portion of the wiring line opening while exposing a portion of the low k dielectric layer in the wiring opening is exposed;

removing the second photoresist layer and simultaneously forming a via hole within the low k dielectric layer to expose the active region; and forming a metal layer to fill the wiring line opening and the via hole.

2. The method according to claim 1, wherein the cap layer is made of silicon nitride.

3. The method according to claim 1, wherein the cap layer is made of silicon-oxy-nitride.

4. The method according to claim 1, wherein before the step of forming a metal layer to fill the wiring line opening and the via hole further comprises forming a barrier layer on the sidewall of the wiring line opening and the via opening.

5. The method according to claim 1, wherein the cap layer is used as a mask during the step of removing the second photoresist layer and simultaneously forming a via hole within the low k dielectric layer.

6. The method according to claim 1, wherein a thickness of the cap layer is in a range of about 100–200 angstroms.

7. A method of fabricating a dual damascene adapted to a substrate having an active region, comprising:

successively forming a first barrier layer, a low k dielectric layer and a cap layer on the substrate;

forming a first photoresist layer on the cap layer;

using the first photoresist layer to pattern the cap layer, which patterning exposes a portion of the low k dielectric layer;

using the cap layer as an etching stop to simultaneously remove the first photoresist layer and a portion of the low k dielectric layer to form a wiring line opening and a trench;

forming a second photoresist layer on the cap layer to at least cover a portion of the wiring line opening and the trench while exposing a portion of the low k dielectric layer in the wiring opening;

using the cap layer as a mask and the first barrier layer as an etching stop to remove the second photoresist layer and simultaneously etching the low k dielectric layer along the exposed low k dielectric layer to form a via hole within the low k dielectric layer that exposes the first barrier layer;

removing the exposed first barrier layer to expose the active region; and forming a second barrier layer and a metal layer in the wiring line opening, the via hole and the trench to form a wiring line and a via.

8. The method according to claim 7, wherein the cap layer is made of silicon nitride.

9. The method according to claim 7, wherein the cap layer is made of silicon-oxy-nitride.

10. The method according to claim 7, wherein the first barrier layer is made of silicon nitride.

11. The method according to claim 7, wherein the metal layer is made of copper.

12. The method according to claim 7, wherein a thickness of the cap layer is in a range of about 100–200 angstroms.

* * * * *